(12) United States Patent  
Chang et al.

(10) Patent No.: US 9,263,436 B2  
(45) Date of Patent: Feb. 16, 2016

(54) SEMICONDUCTOR DEVICE AND METHOD FOR FABRICATING THE SAME

(71) Applicant: Vanguard International Semiconductor Corporation, Hsinchu (TW)

(72) Inventors: Hsiung-Shih Chang, Taichung (TW); Jui-Chun Chang, Hsinchu (TW); Shang-Hui Tu, Jhubei (TW); Priyono Tri Sulistyanto, Yogyakarta (ID); Chia-Hao Lee, New Taipei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 65 days.

(21) Appl. No.: 14/265,627

(22) Filed: Apr. 30, 2014

(65) Prior Publication Data

US 2015/0318277 A1    Nov. 5, 2015

(51) Int. Cl.
*H01L 29/66* (2006.01)
*H01L 21/8238* (2006.01)
*H01L 27/06* (2006.01)
*H01L 29/739* (2006.01)
*H01L 29/78* (2006.01)

(52) U.S. Cl.
CPC ...... *H01L 27/0623* (2013.01); *H01L 29/66348* (2013.01); *H01L 29/66681* (2013.01); *H01L 29/7398* (2013.01); *H01L 29/7817* (2013.01)

(58) Field of Classification Search
CPC ............................................... H01L 21/823807
USPC .......................................... 438/231; 257/330
See application file for complete search history.

(56) References Cited

U.S. PATENT DOCUMENTS

| 2004/0217416 A1* | 11/2004 | Hsieh ................... H01L 29/7813 257/329 |
| 2005/0001265 A1* | 1/2005 | Shiraki ................. H01L 21/763 257/330 |
| 2007/0278568 A1* | 12/2007 | Williams .............. H01L 21/761 257/335 |
| 2009/0194785 A1* | 8/2009 | Lu ........................ H01L 29/1095 257/139 |
| 2010/0327315 A1* | 12/2010 | Shirakawa .......... H01L 29/7394 257/139 |
| 2011/0127602 A1* | 6/2011 | Mallikarjunaswamy H01L 21/823807 257/331 |
| 2011/0156682 A1* | 6/2011 | Girdhar ............... H01L 27/0629 323/283 |
| 2012/0175673 A1* | 7/2012 | Lee ..................... H01L 27/0277 257/140 |

* cited by examiner

*Primary Examiner* — Matthew Landau  
*Assistant Examiner* — Igwe U Anya  
(74) *Attorney, Agent, or Firm* — Birch, Stewart, Kolasch & Birch, LLP (57) ABSTRACT

A semiconductor device includes: a semiconductor layer; a first doped well region disposed in a portion of the semiconductor layer; a first doped region disposed in the first doped well region; a second doped well region of an asymmetrical cross-sectional profile disposed in another portion of the semiconductor layer; second, third, and fourth doped regions formed in the second doped well region; a first gate structure disposed over a portion of the semiconductor layer, practically covering the second doped well region; and a second gate structure embedded in a portion of the semiconductor layer, penetrating a portion of the second doped well region.

22 Claims, 9 Drawing Sheets

SEMICONDUCTOR DEVICE AND METHOD FOR FABRICATING THE SAME

BACKGROUND OF THE INVENTION

1. Field of the Invention

The present invention relates to integrated circuit (IC) devices, and particularly to a semiconductor device suitable for application in high-voltage operation and a method for fabricating the same.

2. Description of the Related Art

Recently, as fabrication techniques for semiconductor integrated circuits (ICs) develop, the demands on elements such as controllers, memory, low-voltage operation circuits and high-voltage operation circuits formed over a single chip are also increasing to form a single-chip system with increased integration.

In a single-chip system, a high-voltage device such as an insulated gate bipolar transistor (IGBT) is usually used to improve the power conversion efficiency and reduce electricity loss. The IGBT has the advantages of, for example, high current gain, high operating voltage, and low on-state resistance, and is useful in high-voltage operation applications.

However, with the ongoing trend of size reduction of the single-chip system, an IGBT is needed to comply with the trend of size reduction and maintain predetermined or increased current densities and on-state resistances.

BRIEF SUMMARY OF THE INVENTION

An exemplary semiconductor device comprises a semiconductor, first, second, and third isolations, a first doped well region, a first doped region, a second doped well region, second, third, and fourth doped regions, a first gate structure, and a second gate structure. The semiconductor layer has a first conductivity type. The first, second, and third isolations are formed separately over a portion of the semiconductor layer, thereby defining a first region between the first and second isolations, and a second region between the second and third isolations. The first doped well region is disposed in a portion of the semiconductor layer in the first region and has the first conductivity type. The first doped region is disposed in the first doped well region and has a second conductivity type opposite to the first conductivity type. The second doped well region is disposed in a portion of the semiconductor layer in the second region and has the second conductivity type and an asymmetric cross-sectional profile. The second, third, and fourth doped regions are proximately disposed in the second doped well region, wherein the second and fourth doped regions have dopants of the first conductivity type, and the third doped region has dopants of the second conductivity type. The first gate structure is disposed in a portion of the semiconductor layer in the second region to partially cover the second doped well region. A second gate structure is embedded in a portion of the semiconductor layer in the second region and penetrates a portion of the second doped well region.

An exemplary method for fabricating a semiconductor device comprises providing a semiconductor layer, having dopants of a first conductivity type. A first doped well region and a second doped well region are formed in a portion of the semiconductor layer, wherein the first doped well region has dopants of the first conductivity type, and the second doped well region has dopants of a second conductivity type opposite to the first conductivity type and a symmetric cross-sectional profile. First, second and third isolations are formed over the semiconductor layer, wherein the first and second isolations partially cover a portion of the first doped well region and defines a first region between the first and second isolation, and the third isolation is adjacent to the second doped well region and defines a second region between the second and third isolations. A patterned mask layer having an opening therein is formed over the semiconductor layer, herein the opening exposes a portion of the second doped well region. A trench is funned through the portion of the second doped well region exposed by the opening and a first doped region in a portion of the second doped well region exposed by the trench and a portion of the semiconductor layer under the second doped well region, wherein the first doped region has dopants of the first conductivity type. The patterned mask layer is removed. A thermal diffusion process is performed to diffuse the dopants of the first conductivity type of the first doped region into the second doped well region adjacent thereto, and makes the symmetric cross-sectional profile into an asymmetric cross-sectional profile, wherein a bottom surface of a portion of the second doped web region adjacent to the trench is closer to a top surface of the semiconductor layer than other portions of the second doped well region. A first gate structure is formed over a portion of the semiconductor layer in the second region and a second gate structure in the trench, wherein the first gate structure partially covers the second isolation and the second doped web region. Second, third, fourth and fifth doped regions are formed, wherein the second doped region is formed in a portion of the first doped well region and has dopants of the second conductivity type, and the third and fifth doped regions are formed in a portion of the second doped well region and has dopants of the first conductivity type, and the fourth doped region is formed in a portion of the second doped well region and is between the third and fifth doped regions and has dopants of the second conductivity type.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
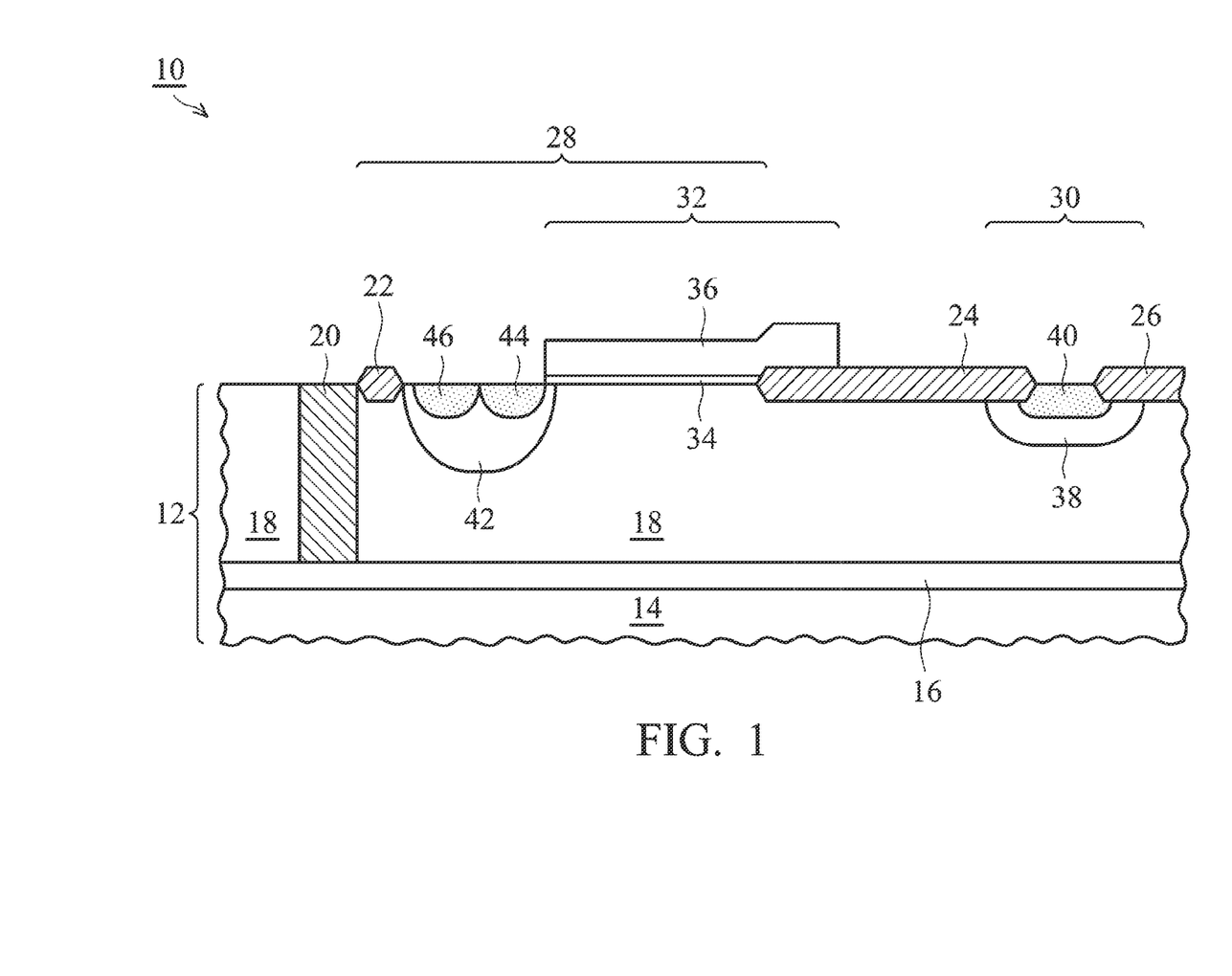
FIG. 1 is schematic cross-sectional view showing a semiconductor device according to an embodiment of the invention.

FIG. 1 is a schematic cross-sectional view showing an exemplary semiconductor device 10 comprising an insulated gate bipolar transistor (IGBT) known by the inventor. The semiconductor device 10 is suitable for high-voltage operation applications.

Herein, the semiconductor device 10 is used as a comparative embodiment, and only one insulated gate bipolar transistor (IGBT) in the semiconductor device 10 is partially illustrated in FIG. 1 to describe issues such as the driving current reduction of the semiconductor device 10 which happens currently with the trend of size reduction.

As shown in FIG. 1, the semiconductor device 10 comprises a semiconductor-on-insulator (SOI) substrate 12. The SOI substrate 12 comprises a bulk semiconductor layer 14, and a buried insulating layer 16 and a semiconductor layer 18 sequentially stacked thereover. The bulk semiconductor layer 14 and the semiconductor layer 18 may comprise semiconductor materials such as silicon, and the buried insulating layer 16 may comprise insulating materials such as silicon dioxide. The semiconductor layer 18 may comprise dopants of a first conductivity type, for example n-type. In the semiconductor device 10, a deep trench isolation 20 is formed in a portion of the semiconductor layer 18, and the deep trench isolation 20 penetrates the semiconductor layer 18 and arrives the buried insulating layer 16, thereby defining an active region (not shown) for disposing the IGBT. The deep trench isolation 20 may comprise insulating materials such as silicon dioxide.

In addition, three isolations 22, 24 and 26 are formed separately over the semiconductor layer 18, and a source region 28 and a drain region 30 are thus defined over the surface of the semiconductor layer 18. Herein, the isolations 22, 24 and 26 are illustrated as field oxides (FOXs) formed over a portion over the surface of the semiconductor layer 18. The source region 28 is a region substantially between the isolations 22 and 24, and the drain region 30 is a region substantially between the isolations 24 and 26. In addition, a gate structure 32 is further formed over the semiconductor layer 18. The gate structure 32 is formed over a portion of the semiconductor layer 18 in the source region 28 and extends over a portion of the isolation 24 adjacent to the source region 28. Herein, the gate structure 32 comprises a gate dielectric layer 34 and a gate electrode 36. The gate dielectric layer 34 is only formed over the surface of the semiconductor layer 18, and the gate electrode 36 is formed over the gate dielectric layer 34 and further extends to cover a portion of the isolation 24 adjacent thereto.

Moreover, a doped well region 38 is formed in a portion of the semiconductor layer 18 in the drain region 30, having dopants of the first conductivity type the same as that of the semiconductor layer 18. The dopant concentration in the doped well region 38 is greater than that of the semiconductor layer 18. A doped region 40 is further formed in the doped well region 38, having dopants of a second conductivity type, for example p-type, opposite to the first conductivity type of the doped well region 38 and the semiconductor layer 18. Herein, the dopant concentration in the doped region 40 is greater than the dopant concentration in the doped well region 38. In addition, a doped well region 42 is formed in a portion of the semiconductor layer 18 in the source region 28, having dopants of the second conductivity type, for example p-type, opposite to that of the semiconductor layer 18. Two adjacent doped regions 46 and 44 are formed in the doped well region 42 and the doped regions 46 and 44 are surrounded by the doped well region 42. The doped region 46 comprises dopants of the second conductivity type opposite to that of the semiconductor layer 18, and the doped region 44 comprises dopants of the first conductivity type the same as that of the semiconductor layer 18. Dopant concentrations of the doped regions 44 and 46 are greater than the dopant concentration of the doped well region 42. Herein, the gate structure 32 covers a portion of the doped well region 42 and the doped region 44.

In one embodiment, the first conductivity type in the semiconductor device 10 is n-type and the second conductivity type in the semiconductor device 10 is p-type. Thus, the doped region 40 may function as an emitter of a PNP bipolar transistor, and the semiconductor layer 18 may function as a base of the PNP bipolar transistor, and the doped region 46 may function as a collector of the PNP bipolar transistor. In addition, the doped layer 40 may also function as a drain of an N-type high voltage metal-oxide-semiconductor (MOS) transistor, and the doped region 44 may function as a source of the N-type HV MOS transistor, and the gate structure 32 may function as a gate of the N-type HV MOS transistor. The portion of the gate structure 32 covering the doped region 42 may function as a channel of the N-type HV MOS transistor.

During operation of the semiconductor device 10 comprising the IGBT shown in FIG. 1, a positive emitter voltage relative to the collector (i.e. the doped region 46) is applied to the doped region 40, and a gate voltage greater than the threshold voltage of the N-type HV MOS transistor allows currents to pass through the N-type HV MOS transistor, thereby modulating the base currents which are connected to the collector and formed between the emitter and the collector. In addition, due to formation of the N-type HV MOS transistor, more base currents can be provided to the PNP bipolar transistor. Moreover, due to formation of the n-type semiconductor layer 18, the voltage drop of the base currents in the base can be reduced.

However, since the IGBT in the semiconductor device 10 comprise a planar type gate (i.e. the gate structure 32), aspects of electrical performances such as driving current and the on-state resistance thereof cannot be improved any further currently with the size reduction of the semiconductor device 10 and the region of the IGBT in the semiconductor device 10.

Accordingly, a semiconductor device comprising an insulated gate bipolar transistor IGBT) suitable for high-voltage operation applications and a method for fabricating the same are thus provided. The semiconductor device comprising the IGBT may maintain or improve electrical performance such as driving current and on-state resistance currently with the trend of size reduction.

FIGS. 2-9 are schematic views showing an exemplary method for fabricating a semiconductor device 100 comprising an IGBT. Herein, FIGS. 2-9 respectively show fabrication in an intermediate stage of the method for fabricating the semiconductor device 100.

Figure 2:
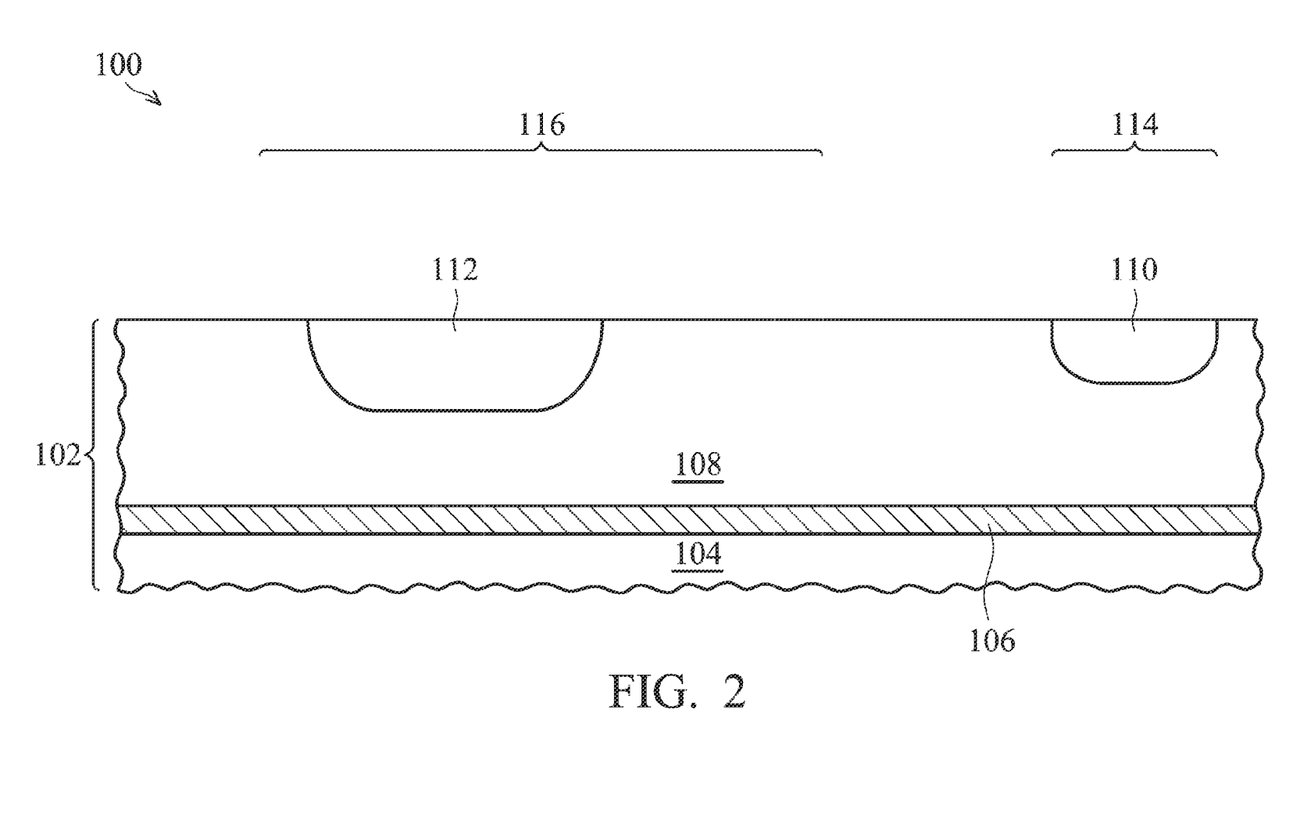
FIGS. 2-9 are schematic cross-sectional views showing a method for fabricating a semiconductor device according to an embodiment of the invention.

In FIG. 2, a semiconductor substrate 102 is first provided. Herein, the semiconductor substrate 102 can be, for example, a semiconductor-on-insulator (SOI) substrate. The SOI substrate comprises a bulk semiconductor layer 104, and a buried insulating layer 106 and a semiconductor layer 108 sequentially stacked over the hulk semiconductor layer 104. The bulk semiconductor layer 104 and the semiconductor layer 108 may comprise semiconductor materials such as silicon, and the buried insulating layer 106 may comprise insulating materials such as silicon dioxide. The semiconductor layer 108 may comprise dopants of a first conductivity type, for example n-type.

Next, implantation processes (not shown) such as ion implantation processes are performed using suitable implantation masks (not shown) to form a doped well region 112 in a portion of the semiconductor layer 108 in a source region 116 for defining an IGBT of the semiconductor device 100, and a doped well region 110 in a portion of the semiconductor layer 108 in a drain region 114 for defining the IGBT of the semiconductor device 100. Herein, the doped well region 112 has dopants of a second conductivity type, for example p-type, opposite to the first conductivity type of the semiconductor layer 108 and a symmetric cross-sectional profile, and the doped well region 110 as dopants of the first conductivity type the same with that of the semiconductor layer 108.

Figure 3:
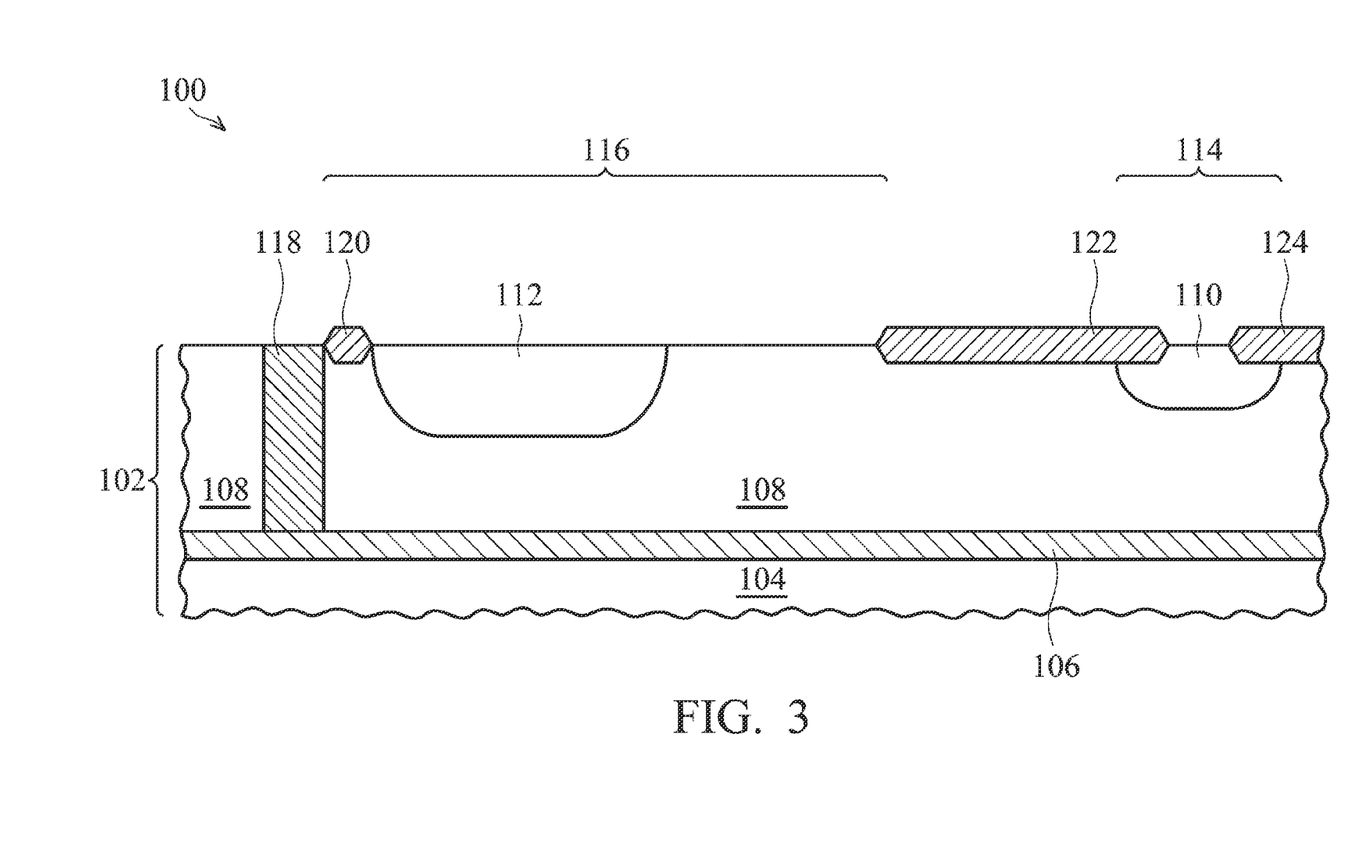

In FIG. 3, a deep trench isolation 118 and at least three isolations 120, 122, and 124 are next formed in and over the semiconductor layer 108. Herein, the deep trench isolation 118 is formed in a portion of the semiconductor layer 108 adjacent to a side of the doped well region 112 and extends downward to reach the buried insulating layer 106. The deep trench isolation 118 can be formed by etching a portion of the semiconductor layer 108 to first form a deep trench (not shown) exposing a portion of the buried insulating layer 106 and then filling the deep trench with insulating materials such as silicon dioxide. The isolations 120, 122, and 124 can be formed by, for example, thermal oxidation by using suitable patterned masks, and thus are separately formed over various portions of the semiconductor layer 108. Herein, the isolations 120, 122, and 124 are field oxides of silicon dioxide which are formed by thermal oxidation. The isolation 120 is disposed over the semiconductor layer 108 between the doped well region 112 and the deep trench isolation 118, and the isolations 122 and 124 are formed over the semiconductor layer 108 at opposite sides of the doped well region 110 and partially cover the doped well region 110.

Figure 4:
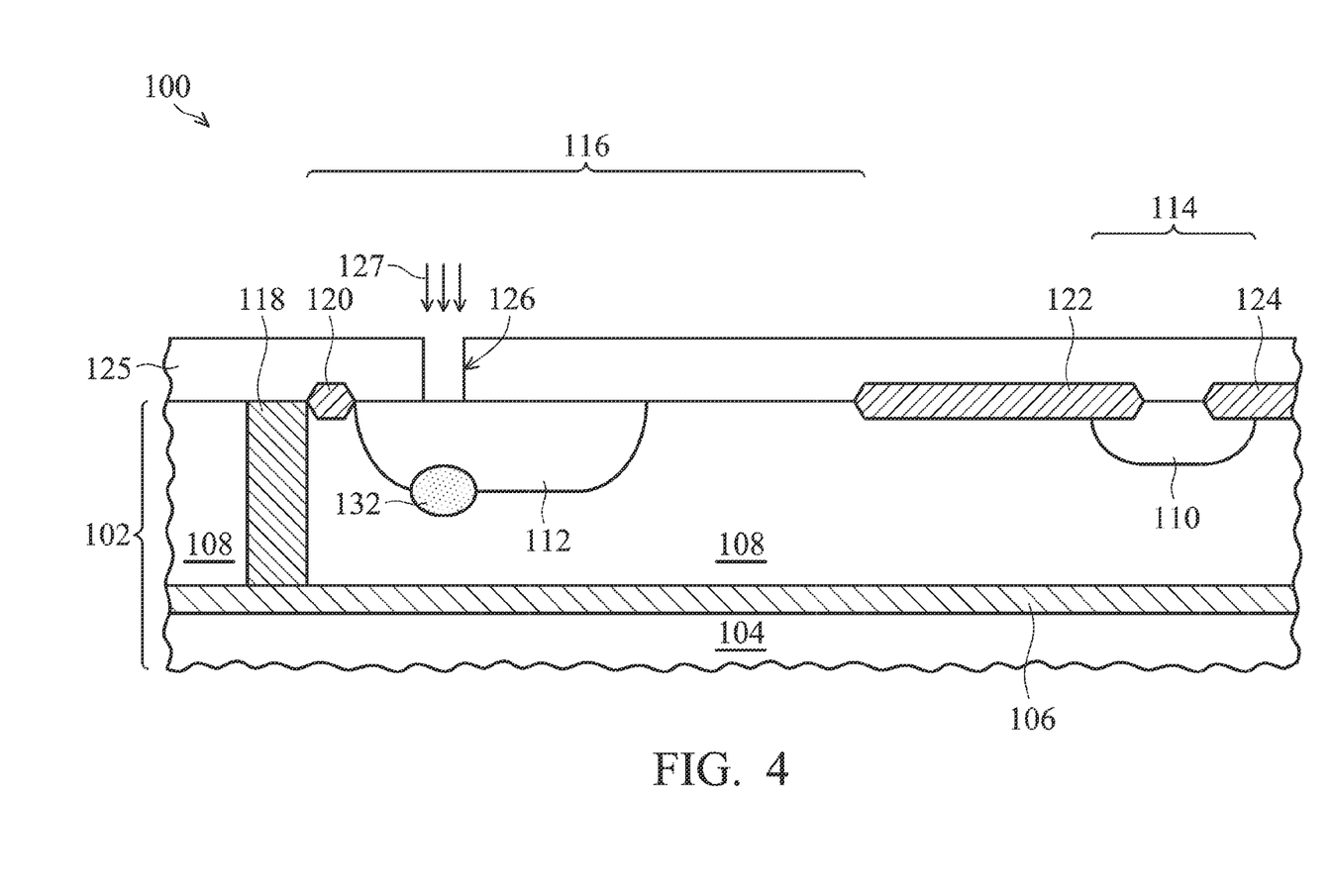

In FIG. 4, a patterned mask layer 125 is next formed over the surface of the semiconductor layer 108 and covers the deep trench isolation 118 and the isolations 120, 122, and 124. An opening 126 is formed in the patterned mask layer 125 to expose a portion of the doped well region 112. In one embodiment, the patterned mask layer 125 is a photoresist layer, and the opening 126 can thus be formed by processes such as photolithography and etching processes. Next, an ion implantation process 127 is performed, using the patterned mask layer 125 as an implantation mask, to implant dopants of the first conductivity type into a portion of the lower portion of the doped well region 112 exposed by the opening 126 and a portion of the semiconductor layer 108 thereunder, thereby forgoing a doped region 132. Dosages and energies used in the ion implantation process 127 can be properly adjusted to control the location of the formed doped region 132.

Figure 5:
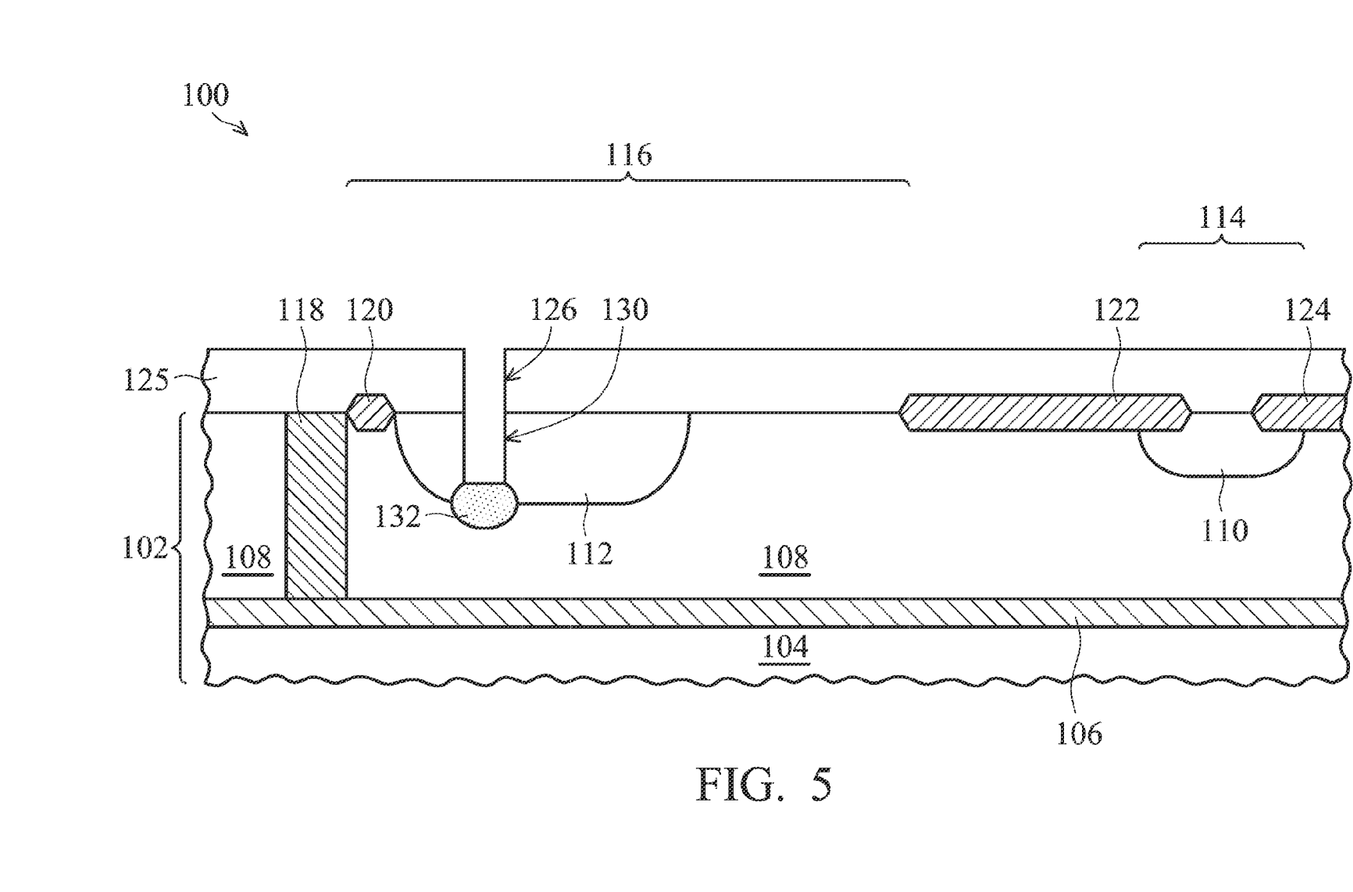

In FIG. 5, an etching process (not shown) is performed next, using the patterned mask layer 125 as an etching mask, to remove the portion of the doped well region 112 exposed by the opening 126, and form a trench 130 in the portion of the doped region exposed by the opening 126. The trench 130 partially penetrates the doped well region 112 and exposes a top surface of the doped region 132. In the above etching process, a portion of the doped region 132 (not shown) may be also etched and removed.

Figure 6:
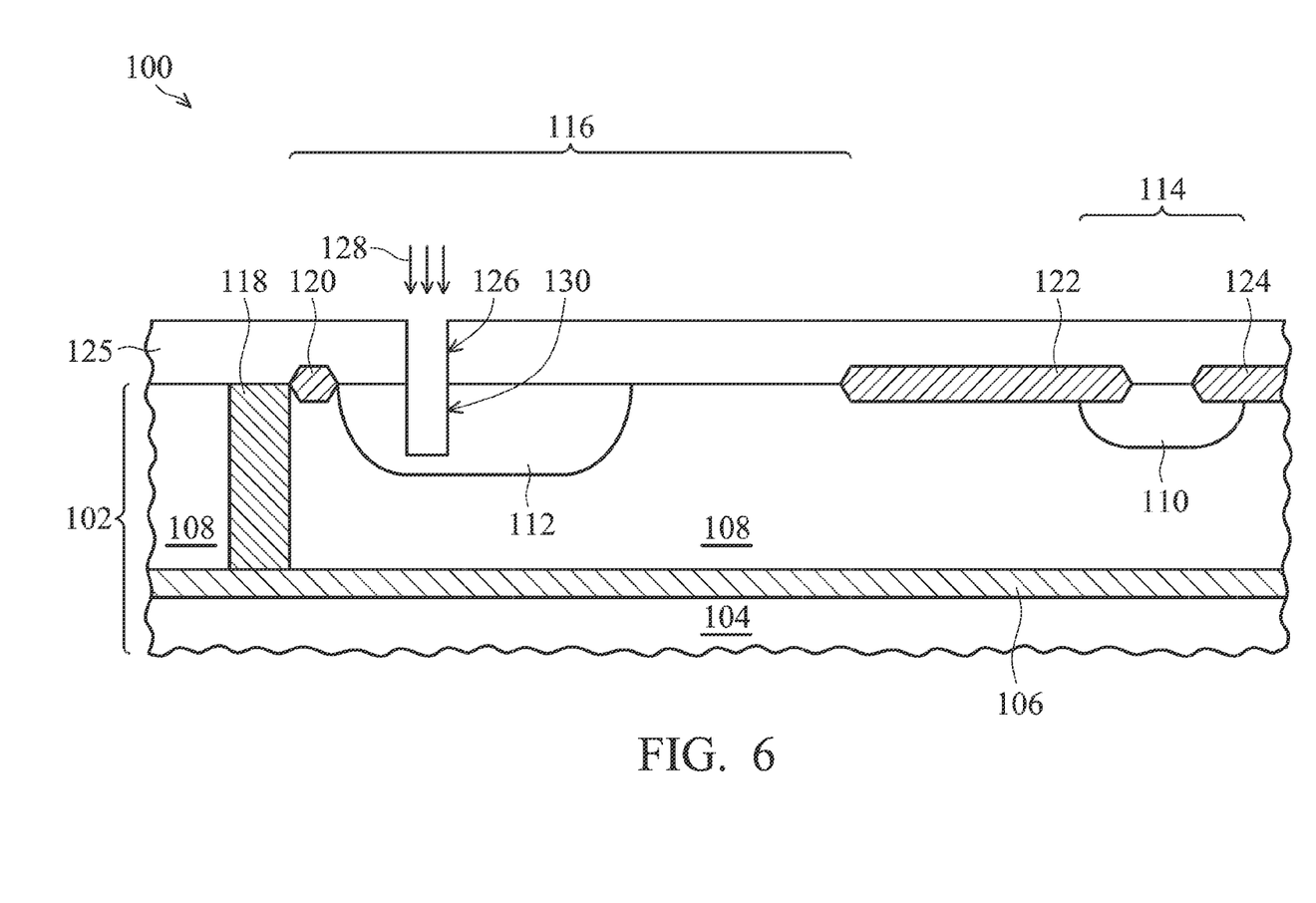

In another embodiment, the sequence of the ion implantation process and the etching process performed in FIGS. 4-5 may be reversed. As shown in FIG. 6, after forming the patterned mask layer 125 having the opening 126 over the semiconductor layer 108, an etching process 128 is first performed, using the patterned mask layer 125 as an etching mask, to remove a portion of the doped well region 112 exposed by the opening 126, and a trench 130 is formed in a portion of the doped well region 112 exposed by the opening 126. The trench 130 partially penetrates the doped well region 112.

Figure 7:
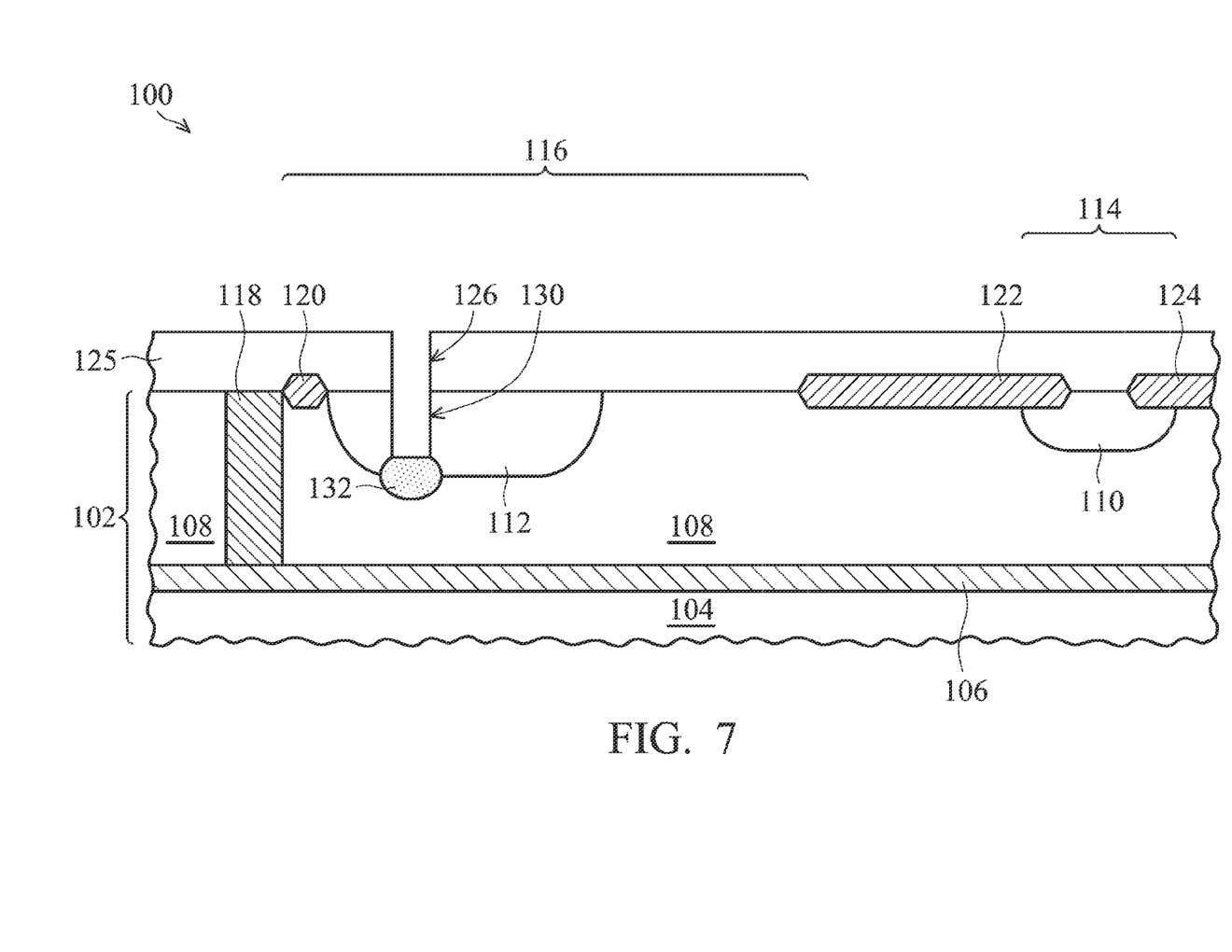

In FIG. 7, an ion implantation process (not shown) is performed, using the patterned mask layer 125 as an implant mask, to implant dopants of the first conductivity type to a portion of the doped well region 112 exposed by the trench 130 and a portion of the semiconductor layer 108 thereunder, thereby forming a doped region 132 under the trench 130 and a portion of the semiconductor layer 108 exposed by the trench 130, and the trench 130 partially exposes the surface of the doped region 132.

Figure 8:
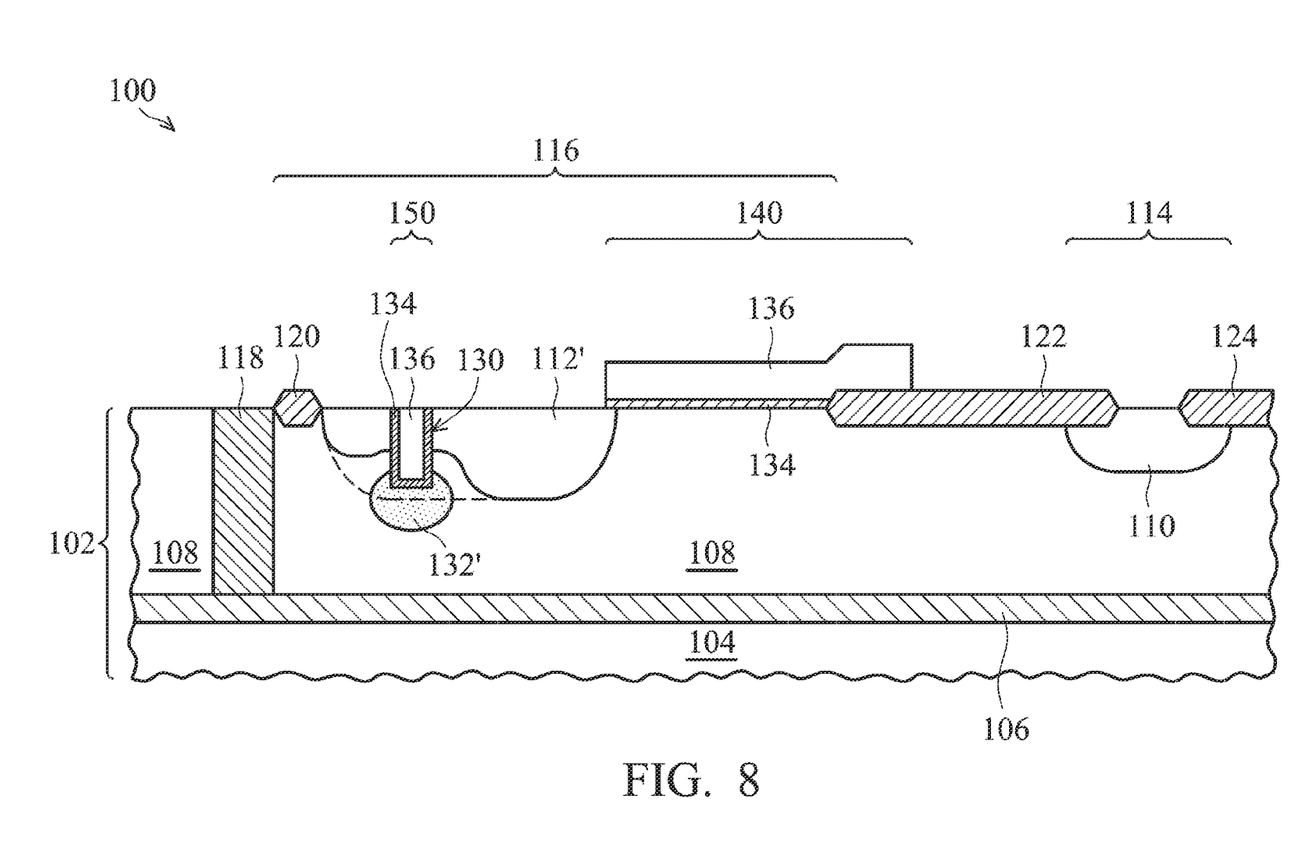

In FIG. 8, after removal of the patterned mask layer 125 shown FIGS. 4-7, a thermal diffusion process (not shown), for example an annealing process, is then performed to diffuse the dopants of the first conductivity type in the doped region 132 into the adjacent doped well region 112 (see FIGS. 5 and 7) and changes the symmetric cross-sectional profile of the doped well region 112. The change to the cross-sectional profile is illustrated as the doped dwell region 112' shown in FIG. 8. Herein, the doped dwell region 112' no longer has a symmetric cross-sectional profile as that shown in FIGS. 2-7 but an asymmetric cross-sectional profile. After the thermal diffusion process, the profile of the doped region 132 is also changed and identified with the reference number 132' in FIG. 8. The diffused doped region 132' covers a lower portion of the trench 130.

Next, two gate structures 140 and 150 are separately formed over the semiconductor layer 108. The gate structure 140 is formed over the semiconductor layer 108 between the doped well region 112 and the isolation 122, and the gate structure 150 is formed in the trench 130 and fills the same. Herein, the gate structures 140 and 150 respectively comprise a gate dielectric layer 134 and a gate electrode layer 136. The gate dielectric layer 134 and a gate electrode layer 136 in gate structure 140 and 150 can be formed in the same processes, and the fabrication and materials thereof can be the same as those of the conventional gate dielectric layer and gate electrode layer, and are not described herein.

Figure 9:
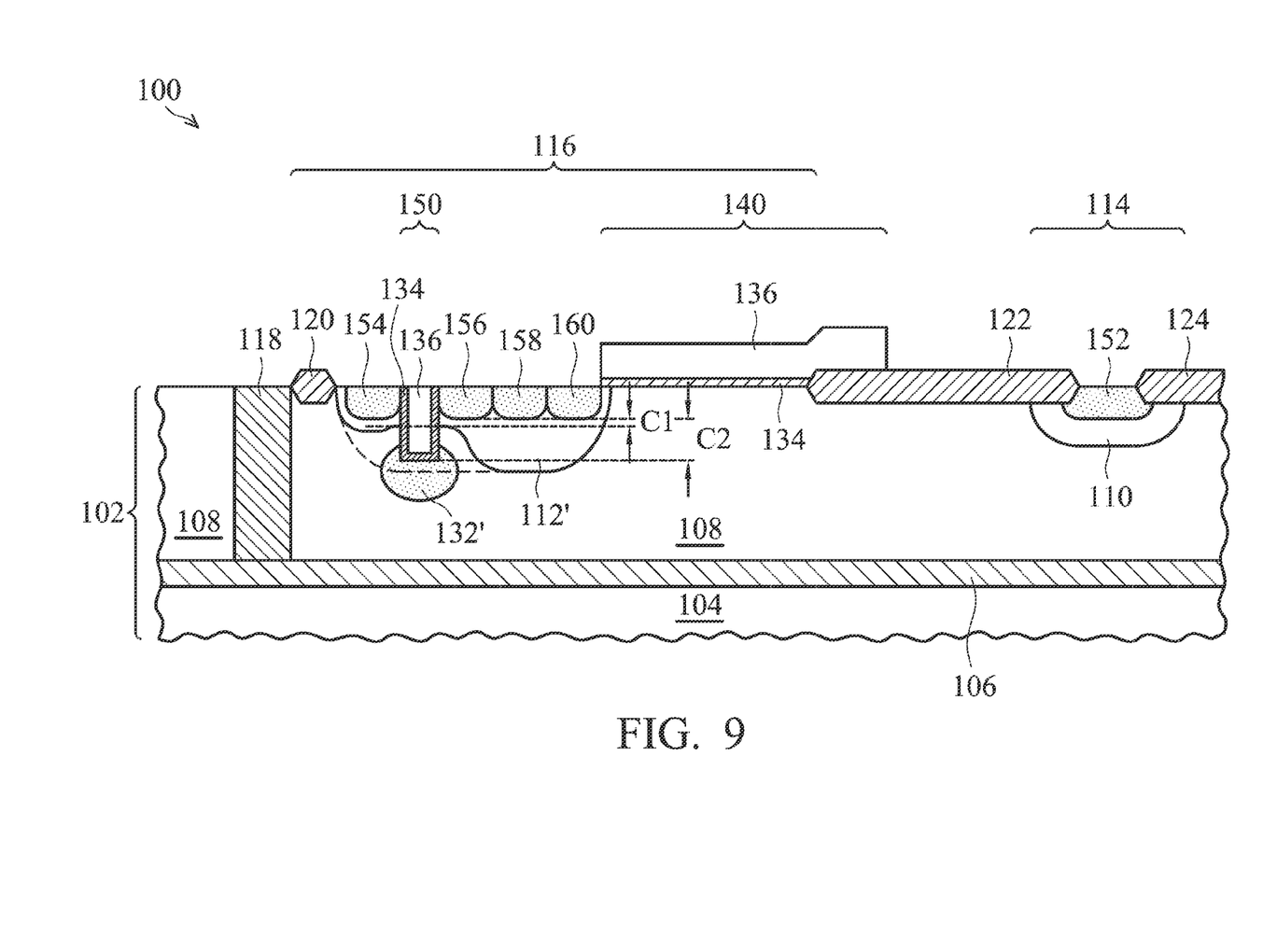

In FIG. 9, through the usage of suitable imp an masks (not shown) and operations of several implantation processes such as ion implantation processes, a doped region 152 is formed in a portion of the doped dwell region 1110, and a plurality of adjacent doped regions 154, 156, 158, and 160 are formed in the doped well region 112'. Herein, the doped regions 152, 154, and 158 have dopants of the second conductivity type opposite to the first conductivity type of the semiconductor layer 108, and the doped regions 156 and 160 have dopants of the first conductivity type the same as that of the semiconductor layer 108. The concentration of the doped regions 152, 154, 156, 158, and 160 are greater than the doped well region 110 or 112' adjacent thereto.

As shown in FIG. 9, a method for fabricating the semiconductor device 100 comprising an IGBT device is substantially completed. Additional contacts, interconnects, and insulating layers can be sequentially formed in the sequential processes to form related connection circuits, and the fabrication of these components is not described here for simplicity.

In one embodiment, the first conductivity type in the semiconductor device 100 shown in FIG. 9 is n-type and the second conductivity type in the semiconductor device 100 is p-type. Thus, the doped region 152 may function as an emitter of a PNP bipolar transistor, and the semiconductor layer 108 may function as a base of the PNP bipolar transistor, and the doped region 158 may function as a collector of the PNP bipolar transistor.

In addition, the doped region 152 may also function as a drain of an N-type high voltage metal-oxide-semiconductor (MOS) transistor comprising the gate structure 140, and the doped region 160 may function as a source of the N-type HV MOS transistor comprising the gate structure 140, and the gate structure 140 may function as a gate of the N-type HV MOS transistor. The portion of the gate structure 140 covering the doped region 112' may function as a channel of the N-type HV MOS transistor.

Moreover, another N-type metal-oxide-semiconductor (MOS) transistor is disposed in the semiconductor device 100, comprising the gate structure 150. The doped region 152 may also function as a drain of an N-type metal-oxide-semiconductor (MOS) transistor comprising the gate structure 150, and the doped region 156 may function as a source of the N-type MOS transistor comprising the gate structure 150, and the gate structure 150 may function as a gate of the N-type MOS transistor. The portion of the doped region 112' covered by the gate structure 150 may function as a channel of the N-type MOS transistor, which is entitled as C1 in FIG. 9. A bottom surface of the portion of the doped well region 112' adjacent to the doped regions 156 and 154 is closer to the top surface of the semiconductor layer 108 than other portions of the doped well region 112'. Compared with another channel C2 of an imaginary N-type MOS transistor comprising the gate structure 150 and the original doped well region 112 (illustrated with dotted line here, see FIG. 2-7) which is not formed with the doped region 132' and is not affected by diffusion of the doped region 132', having the original cross-sectional profile, the asymmetric cross-sectional profile of the doped well region 112' adjacent to the gate structure 150 caused due to formation and diffusion of the doped region 132' may reduce the length of the channel C1, thereby improving driving currents of the N-type MOS transistor comprising the gate structure 150.

Moreover, during operation of the semiconductor device 100 comprising the IGBT shown in FIG. 9, a positive emitter voltage relative to the collector (i.e. the doped region 158) is applied to the doped region 152, and a gate voltage greater than the threshold voltage of the N-type MOS transistor and the N-type HV MOS transistor of the semiconductor device 100 allows currents to pass through the N-type MOS transistor and the N-type HV MOS transistor, thereby modulating the base currents which are connected to the collector and firmed between the emitter and the collector. In addition, due to formation of the N-type MOS transistor and the N-type HV MOS transistor, more base currents can be provided to the PNP bipolar transistor. Moreover, due to fore ration of the n-type semiconductor layer 108, voltage drop of the base currents in the base can be reduced.

When compared with the semiconductor device 10 shown in FIG. 1, since an additional MOS device is provided in the semiconductor device 100 shown in FIG. 9, the semiconductor device 100 shown in FIG. 9 may have improved electrical performance such as increased driving currents and on-state resistance than the semiconductor device 10 shown in FIG. 1. Therefore, the electrical performances such as driving current and on-state resistance of the elements in the semiconductor device 100 can be maintained or improved currently with the trend of size reduction of the semiconductor device 100 and the region of the IGBT in the semiconductor device 100. Moreover, since the semiconductor device 100 shown in FIG. 9 is formed over a SOI substrate and a deep trench isolation 118 is formed in a portion of the semiconductor layer 108 of the SOI substrate, noises affecting the semiconductor device 100 can be reduced and a latch-up effect in the semiconductor device 100 is thus prevented.

The scope of the invention is not limited to the semiconductor device 100 shown in FIG. 9, and a plurality of IGBT can be provided and properly arranged in the semiconductor device. For the purpose of simplicity, fabrications and arrangements thereof are not described here.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a semiconductor layer having a first conductivity type;
first, second, and third isolations, formed separately over a portion of the semiconductor layer, thereby defining a first region between the first and second isolations, and a second region between the second and third isolations;
a first doped well region, disposed in a portion of the semiconductor layer in the first region, having the first conductivity type;
a first doped region, disposed in the first doped well region, having a second conductivity type opposite to the first conductivity type;
a second doped well region, disposed in a portion of the semiconductor layer in the second region, having the second conductivity type and an asymmetric cross-sectional profile;
second, third, and fourth doped regions, proximately disposed in the second doped well region, wherein the second and fourth doped regions have dopants of the first conductivity type, and the third doped region has dopants of the second conductivity type;
a first gate structure disposed in a portion of the semiconductor layer in the second region, partially covering the second doped well region;
a second gate structure embedded in a portion of the semiconductor layer in the second region, penetrating a portion of the second doped well region; and
a fifth doped region, disposed under the second gate structure and the second doped well region, having the first conductivity type, wherein the fifth doped region and the second doped well region are separated by a portion of the semiconductor layer.

2. The semiconductor device as claimed in claim 1, wherein the first conductivity type is n-type, and the second conductivity type is p-type.

3. The semiconductor device as claimed in claim 1, wherein the second doped region is adjacent to the first gate structure, and the fourth doped region is adjacent to the second gate structure, and the third doped region is disposed between the second and fourth dope regions.

4. The semiconductor device as claimed in claim 3, wherein the first doped region functions as an emitter, the third doped region functions as a collector, and the semiconductor layer functions as a base, thereby forming a bipolar transistor.

5. The semiconductor device as claimed in claim 3, wherein the first doped region functions as a drain, the second doped region functions as a source, and the first doped region, the second doped region, and the first gate structure form a metal-oxide-semiconductor (MOS) transistor.

6. The semiconductor device as claimed in claim 5, wherein an overlapping region of the first gate structure and the second doped region is a channel of the MOS transistor.

7. The semiconductor device as claimed in claim 3, wherein the first doped region functions as a drain, the fourth doped region functions as a source, and the first doped region, the fourth doped region, and the second gate structure form a metal-oxide-semiconductor (MOS) transistor.

8. The semiconductor device as claimed in claim 7, wherein an overlapping region of the second gate structure and the second doped well region is a channel of the MOS transistor.

9. The semiconductor device as claimed in claim 1, wherein a portion of a bottom surface of the second doped well region is closer to the fourth doped region, and another portion of the second doped well region is further away from the second and third doped regions.

10. The semiconductor device as claimed in claim 1, wherein the first and second gate structures comprise a gate dielectric layer and a gate electrode layer, respectively.

11. A method for fabricating a semiconductor device, comprising:
providing a semiconductor layer, having dopants of a first conductivity type;
forming a first doped well region and a second doped well region in a portion of the semiconductor layer, wherein the first doped well region has dopants of the first conductivity type, and the second doped well region has dopants of a second conductivity type opposite to the first conductivity type and a symmetric cross-sectional profile;
forming first, second and third isolations over the semiconductor layer, wherein the first and second isolations partially cover a portion of the first doped well region and defines a first region between the first and second isolation, and the third isolation is adjacent to the second doped well region and defines a second region between the second and third isolations;
forming a patterned mask layer having an opening therein over the semiconductor layer, wherein the opening exposes a portion of the second doped well region;
forming a trench through the portion of the second doped well region exposed by the opening and a first doped region in a portion of the second doped well region exposed by the trench and a portion of the semiconductor layer under the second doped well region, wherein the first doped region has dopants of the first conductivity type;
removing the patterned mask layer;
performing a thermal diffusion process, diffusing the dopants of the first conductivity type of the first doped region into the second doped well region adjacent thereto, making the symmetric cross-sectional profile into an asymmetric cross-sectional profile, wherein a bottom surface of a portion of the second doped well region adjacent to the trench is closer to a top surface of the semiconductor layer than other portions of the second doped well region;
forming a first gate structure over a portion of the semiconductor layer in the second region and a second gate structure in the trench, wherein the first gate structure partially covers the second isolation and the second doped well region; and
forming second, third, fourth and fifth doped regions, wherein the second doped region is formed in a portion of the first doped well region and has dopants of the second conductivity type, and the third and fifth doped regions are formed in a portion of the second doped well region and has dopants of the first conductivity type, and the fourth doped region is formed in a portion of the second doped well region and is between the third and fifth doped regions and has dopants of the second conductivity type.

12. The method as claimed in claim 11, wherein the step of forming the trench through the portion of the second doped well region exposed by the opening and the first doped region in a portion of the second doped well region exposed by the trench and a portion of the semiconductor layer under the second doped well region comprises:

performing an ion implantation process, using the patterned mask layer having the opening as an implant mask, implanting dopants of the first conductivity type into the portion of the second doped well region exposed by the opening and the portion of the semiconductor layer thereunder, thereby forming the first doped region; and
performing an etching process, using the patterned layer having the opening as an etching mask, partially removing the second doped well region exposed by the opening and forming the trench and exposing the first doped region.

13. The method as claimed in claim 11, wherein the step of forming the trench through the portion of the second doped well region exposed by the opening and the first doped region in a portion of the second doped well region exposed by the trench and a portion of the semiconductor layer under the second doped well region comprises:
performing an etching process, using the patterned layer having the opening as an etching mask, partially removing the second doped well region exposed by the opening and forming the trench and exposing the portion of the second doped region; and
performing an ion implantation process, using the patterned mask layer having the opening as an implant mask, implanting dopants of the first conductivity type into the portion of the second doped well region and the portion of the semiconductor thereunder exposed by the opening and the trench, thereby forming the first doped region.

14. The method as claimed in claim 11, wherein the first conductivity type is n-type, and the second conductivity type is p-type.

15. The method as claimed in claim 11, wherein the third doped region is adjacent to the first gate structure, and the fifth doped region is adjacent to the second gate structure.

16. The method as claimed in claim 11, wherein the second doped region functions as an emitter, the fourth region functions as a collector, and the semiconductor layer functions as a base, thereby forming a bipolar transistor.

17. The method as claimed in claim 16, wherein the second doped region functions as a drain, and the third doped region functions as a source, and the second and third doped regions and the first gate structure form a metal-oxide-semiconductor (MOS) transistor.

18. The method as claimed in claim 17, wherein an overlapping region between the first gate structure and the second doped well region is a channel of the MOS transistor.

19. The method as claimed in claim 16, wherein the second doped region functions as a drain, the fifth doped region functions as a source, and the second and fifth doped regions and the second gate structure form a metal-oxide-semiconductor (MOS) transistor.

20. The method as claimed in claim 19, wherein an overlapping region between the second gate structure and the second doped region is a channel of the MOS transistor.

21. The method as claimed in claim 11, wherein a portion of a bottom surface of the second doped well region is closer to the fourth doped region, and another portion of the second doped well region is further far from the second and third doped regions.

22. The method as claimed in claim 11, wherein the first and second gate structure comprise a gate dielectric layer and a gate electrode layer, respectively.

* * * * *